United States Patent
Tai et al.

(10) Patent No.: US 8,754,373 B2
(45) Date of Patent: Jun. 17, 2014

(54) PYROELECTRIC ELEMENT AND METHOD FOR MANUFACTURING THE SAME

(75) Inventors: Tomoyoshi Tai, Aichi (JP); Kenji Suzuki, Aichi (JP); Jungo Kondo, Aichi (JP)

(73) Assignee: NGK Insulators, Ltd., Aichi-prefecture (JP)

( * ) Notice: Subject to any disclaimer, the term of this patent is extended or adjusted under 35 U.S.C. 154(b) by 0 days.

(21) Appl. No.: 13/637,717

(22) PCT Filed: Feb. 16, 2012

(86) PCT No.: PCT/JP2012/053642
§ 371 (c)(1),
(2), (4) Date: Sep. 27, 2012

(87) PCT Pub. No.: WO2012/114972
PCT Pub. Date: Aug. 30, 2012

(65) Prior Publication Data
US 2013/0015353 A1    Jan. 17, 2013

(30) Foreign Application Priority Data
Feb. 24, 2011    (JP) .................................. 2011-037850

(51) Int. Cl.
*G01J 5/00* (2006.01)
(52) U.S. Cl.
USPC ..................................... 250/338.3; 250/338.1
(58) Field of Classification Search
USPC ....................................................... 250/338.3
See application file for complete search history.

(56) References Cited

U.S. PATENT DOCUMENTS

| 4,383,174 | A | 5/1983 | Matsumura et al. |
| 4,806,763 | A | 2/1989 | Turnbull |
| 5,614,717 | A | 3/1997 | Ma |
| 6,222,304 | B1 | 4/2001 | Bernstein |
| 7,897,921 | B2 * | 3/2011 | Horikawa et al. .......... 250/338.3 |
| 2011/0163872 | A1 * | 7/2011 | Pasveer et al. .......... 340/539.12 |

FOREIGN PATENT DOCUMENTS

| GB | 2020097 A | 11/1979 |
| JP | 54-108678 A | 8/1979 |
| JP | 56-046427 A | 4/1981 |
| JP | 63-134921 A | 6/1988 |

(Continued)

OTHER PUBLICATIONS

International Preliminary Report on Patentability for PCT Patent App. No. PCT/JP2012/053642 (Sep. 6, 2013).

(Continued)

*Primary Examiner* — David Porta
*Assistant Examiner* — Carolyn Igyarto
(74) *Attorney, Agent, or Firm* — Cermak Nakajima LLP; Tomoko Nakajima

(57) ABSTRACT

A pyroelectric element includes a pyroelectric substrate; a light-receiving section composed of a front-side electrode, a back-side electrode, and a light-receiving portion; and a light-receiving section composed of a front-side electrode, a back-side electrode, and a light-receiving portion. Since the pyroelectric substrate warps in a cavity-facing region opposite a cavity, the light-receiving area of the light-receiving sections is greater than that in the case where there is no warp. It is thus possible to improve detection sensitivity of the pyroelectric element without making the size of the pyroelectric element larger than that in the case where there is no warp.

6 Claims, 11 Drawing Sheets

(56) References Cited

FOREIGN PATENT DOCUMENTS

| JP | 05-018816 A | 1/1993 |
| JP | 05-231933 A | 9/1993 |
| JP | 08-172225 A | 7/1996 |
| JP | 08-201167 A | 8/1996 |
| JP | 2000-298061 A | 10/2000 |
| JP | 2006-203009 A | 8/2006 |

OTHER PUBLICATIONS

Supplementary European Search Report for European Patent App. No. 12750297.9 (Apr. 19, 2013).
International Search Report for PCT Patent App. No. PCT/JP2012/053642 (May 29, 2012).

* cited by examiner (a)

(b)

(a)

(b)

(a)

(b)

PYROELECTRIC ELEMENT AND METHOD FOR MANUFACTURING THE SAME

This application is a national phase entry under 35 U.S.C. §371 of PCT Patent Application No. PCT/JP2012/053642, filed on Feb. 16, 2012, which claims priority under 35 U.S.C. §119 to Japanese Patent Application No. 2011-037850, filed Feb. 24, 2011, both of which are incorporated by reference.

TECHNICAL FIELD

The present invention relates to a pyroelectric element and a method for manufacturing the same.

BACKGROUND ART

Conventionally, pyroelectric elements have been known which are used as infrared detectors, such as human body sensors and fire sensors. A pyroelectric element includes a pyroelectric substrate and a pair of electrodes disposed on front and back sides of the pyroelectric substrate. The pyroelectric element is configured to have a light-receiving section composed of the pair of electrodes and a portion of the pyroelectric substrate interposed between the pair of electrodes. In the pyroelectric element, when the amount of infrared light applied to the light-receiving section changes, the polarization of the pyroelectric substrate is changed by a pyroelectric effect and electric charge is excited on the front and back sides of the light-receiving section. By extracting the electric charge from the pair of electrodes as a voltage, the pyroelectric element can function as an infrared detector. For example, PTL 1 describes a single-type pyroelectric element that includes a pyroelectric substrate having only one light-receiving section, a dual-type pyroelectric element that includes a pyroelectric substrate having two light-receiving sections, and a quad-type pyroelectric element that includes a pyroelectric substrate having four light-receiving sections. PTL 2 describes an infrared detector that includes a pyroelectric crystal and a silicon plate. The pyroelectric crystal has a light-receiving electrode on an upper surface thereof and a ground electrode on a lower surface thereof. The silicon plate is configured to support the pyroelectric crystal. The silicon plate is provided with a hole in a region opposite the light-receiving electrode. By having the hole in the silicon plate, the infrared detector can prevent an increase in thermal capacity and improve sensitivity for detecting infrared light.

CITATION LIST

Patent Literature

PTL 1: Japanese Unexamined Patent Application Publication No. 2006-203009
PTL 2: Japanese Unexamined Patent Application Publication No. 56-46437

SUMMARY OF INVENTION

Technical Problem

Examples of methods to improve detection sensitivity in a pyroelectric element include increasing the surface area of a light-receiving section. This is because an increase in surface area increases the amount of electric charge excited in the light-receiving section by infrared light, and thus increases the level of voltage that can be extracted. However, an increase in surface area of the light-receiving section leads to an increased size of the pyroelectric element.

The present invention has been made in view of the problems described above. A primary object of the present invention is to improve detection sensitivity of a pyroelectric element without increasing the size of the pyroelectric element.

Solution to Problem

The present invention employs the following means to achieve the object described above.

A pyroelectric element according to the present invention includes a pyroelectric substrate; a supporting member having a cavity and configured to support the pyroelectric substrate from a back side of the pyroelectric substrate at a portion other than the cavity; and a light-receiving section including a pair of electrodes formed on both front and back sides of a cavity-facing region of the pyroelectric substrate and a portion of the pyroelectric substrate interposed between the pair of electrodes, the cavity-facing region being a region of the pyroelectric substrate opposite the cavity. The pyroelectric substrate warps in the cavity-facing region.

In this pyroelectric element where the pyroelectric substrate warps in the cavity-facing region, the surface area of the light-receiving section is greater than that in a pyroelectric element of the same size where there is no warp. It is thus possible to improve detection sensitivity of the pyroelectric element without increasing the size of the pyroelectric element.

In the pyroelectric element according to the present invention, the pyroelectric substrate may warp to protrude on the front side thereof, and may be thinner at a top of the warp than at the rest. Further, the light-receiving section may be formed in plurality in the cavity-facing region of the pyroelectric substrate, other than the top, such that the top is interposed between the light-receiving sections. Thus, since the top of the warp is interposed between the plurality of light-receiving sections and the pyroelectric substrate is thinner at the top than at the rest, easy heat conduction between the plurality of light-receiving sections is less likely to occur. It is thus possible to improve detection sensitivity of a dual-type or quad-type pyroelectric element that includes a plurality of light-receiving sections.

In the pyroelectric element according to the present invention, the pyroelectric substrate may warp to protrude on the front side thereof, and may be thinner at a top of the warp than at the rest. Further, the light-receiving section may be formed at the top. This makes it possible to improve detection sensitivity of the pyroelectric element while preventing degradation in mechanical strength of the pyroelectric element. The reason for this will now be described. In general, although a pyroelectric element with a thinner pyroelectric substrate has higher detection sensitivity because of lower thermal capacity of a light-receiving section, the mechanical strength of the pyroelectric element is lower due to the smaller thickness of the pyroelectric substrate. However, when the light-receiving section is formed at the top where the pyroelectric substrate is thinner, it is possible to prevent degradation in mechanical strength of the pyroelectric element, unlike in the case where the entire pyroelectric substrate is thin. At the same time, since the light-receiving section is thin and thus is low in thermal capacity, high detection sensitivity of the pyroelectric element can be achieved.

In the pyroelectric element according to the present invention, the supporting member may be made of materials having thermal conductivities lower than that of a material of the pyroelectric substrate. Since heat does not easily escape from the pyroelectric substrate to the supporting member, the detection sensitivity of the pyroelectric element can be improved.

In the pyroelectric element according to the present invention, the pyroelectric substrate may be 0.1 μm to 10 μm in thickness in the cavity-facing region.

A method for manufacturing a pyroelectric element according to the present invention includes the steps of (a) forming a composite body that includes a flat pyroelectric substrate having at least one back-side electrode thereon, and a supporting member having a cavity at a portion opposite the back-side electrode and configured to support the pyroelectric substrate from a back side of the pyroelectric substrate at a portion other than the cavity; (b) grinding a front side of the pyroelectric substrate until the pyroelectric substrate warps in a cavity-facing region thereof opposite the cavity; and (c) forming a front-side electrode on the front side of the pyroelectric substrate such that the front-side electrode is paired with the back-side electrode.

In the method for manufacturing the pyroelectric element described above, the step (a) forms a composite body having a cavity at a portion opposite an electrode, and the step (b) grinds a front side of a pyroelectric substrate until the pyroelectric substrate warps in a cavity-facing region thereof opposite the cavity. Thus, as compared to a pyroelectric element of the same size where a pyroelectric substrate does not warp, a pyroelectric element with a light-receiving section that has a larger surface area can be realized because of the warp. It is thus possible to obtain a pyroelectric element having higher detection sensitivity without increasing the size of the pyroelectric element.

In the method for manufacturing the pyroelectric element described above, in the step (b), the front side of the pyroelectric substrate may be ground until the pyroelectric substrate reaches a thickness of 0.1 μm to 10 μm in the cavity-facing region. Grinding the front side until a thickness of 0.1 μm to 10 μm is reached allows the pyroelectric substrate to easily warp.

DESCRIPTION OF EMBODIMENTS

Figure 1:
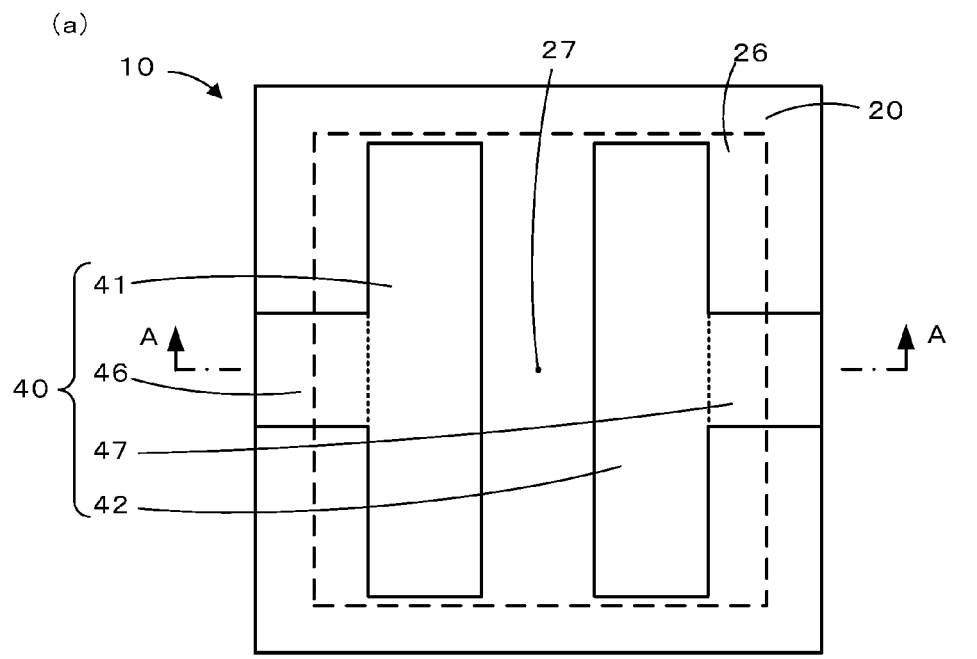
FIG. 1(a) and FIG. 1(b) are a plan view and a cross-sectional view, respectively, of a pyroelectric element 10.
Figure 1:
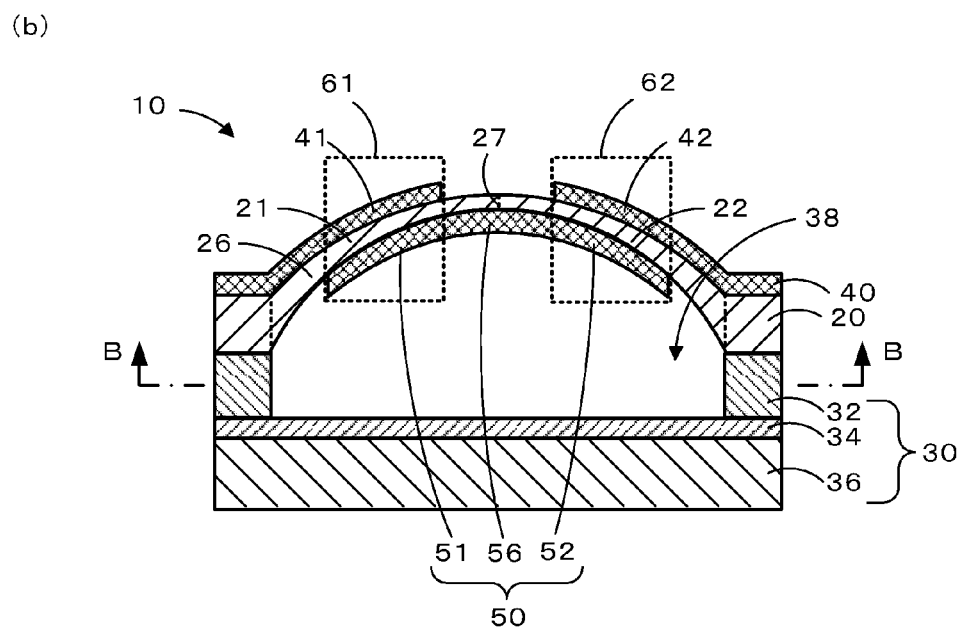
Figure 2:
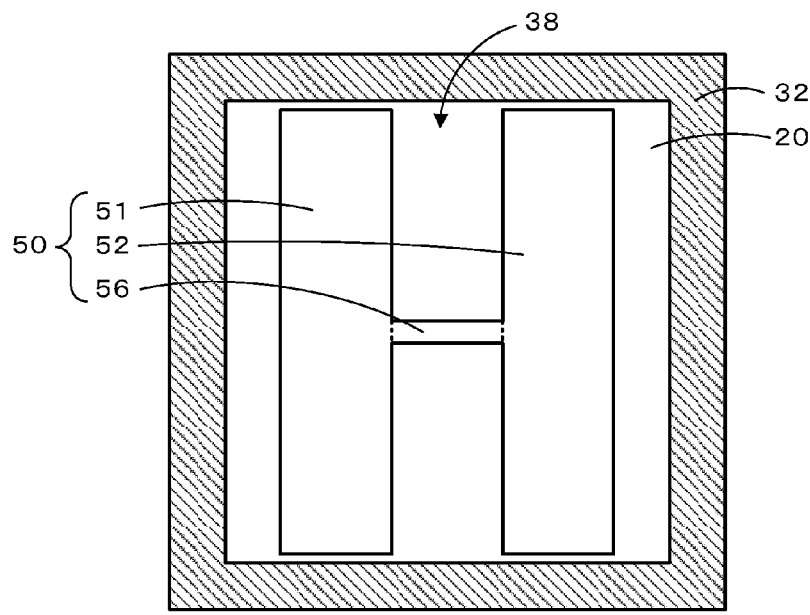
FIG. 2 is a cross-sectional view taken along line B-B of FIG. 1(b).

Hereinafter, embodiments of the present invention will be described with referent to drawings. FIG. 1(a) is a plan view of a pyroelectric element 10 which is one embodiment of the present invention. FIG. 1(b) is a cross-sectional view taken along A-A of FIG. 1(a). FIG. 2 is a cross-sectional view taken along line B-B of FIG. 1(b). The pyroelectric element 10 is configured as a dual-type pyroelectric element that includes two light-receiving sections 61 and 62. The pyroelectric element 10 includes the pyroelectric substrate 20, a supporting member 30 configured to support the pyroelectric substrate 20, a front-side metal layer 40 disposed on a front side of the pyroelectric substrate 20, and a back-side metal layer 50 disposed on a back side of the pyroelectric substrate 20.

The pyroelectric substrate 20 is a substrate of pyroelectric material. Examples of the material of the pyroelectric substrate 20 include ferroelectric ceramic such as lead zirconate titanate, lithium tantalate single crystal, and lithium niobate single crystal. Any cut angle can be selected when, for example, lithium tantalate or lithium niobate single crystal is used. It is preferable, however, that a cut angle closer to that of a 90°-Z-cut plate be selected because of higher pyroelectricity. The size of the pyroelectric substrate 20 is not particularly limited, but is, for example, 0.1 mm to 5 mm in length, 0.1 mm to 5 mm in width, and 0.1 μm to 10 μm in thickness. The pyroelectric substrate 20 warps to protrude on the front side thereof. The pyroelectric substrate 20 is thinner toward a top 27 of the warp, so that the pyroelectric substrate 20 is thinner at the top 27 than at the rest. The thickness of the pyroelectric substrate 20 at the top 27 is not particularly limited, but is, for example, 0.1 μm to 10.0 μm. Note that the warp of the pyroelectric substrate 20 is exaggerated in FIG. 1(b) for better understanding.

The supporting member 30 includes a supporting layer 32, a bonding layer 34, and a supporting substrate 36. The supporting layer 32 is formed on the back side of the pyroelectric substrate 20 to support the pyroelectric substrate 20. Examples of the material of the supporting layer 32 include silicon dioxide. The thickness of the supporting layer 32 is not particularly limited, but is, for example, 0.1 μm to 1 μm. The bonding layer 34 is configured to bond the supporting layer 32 to the supporting substrate 36. The bonding layer 34 is formed over the entire front side of the supporting substrate 36. Examples of the material of the bonding layer 34 include a hardened epoxy adhesive and a hardened acrylic adhesive. The thickness of the bonding layer 34 is not particularly limited, but is, for example, 0.1 μm to 1 μm. Besides the adhesive, direct bonding, such as anode bonding and surface activation, may be used as a bonding method. The supporting substrate 36 is a plate-like substrate bonded to the supporting layer 32, with the bonding layer 34 interposed therebetween. Examples of the material of the supporting substrate 36 include glass, lithium tantalate, and lithium niobate. The size of the supporting substrate 36 is not particularly limited, but is, for example, 0.1 mm to 5 mm in length, 0.1 mm to 5 mm in width, and 0.15 mm to 0.5 mm in thickness. The supporting layer 32, the bonding layer 34, and the supporting substrate 36 are preferably made of materials having thermal conductivities lower than that of the material of the pyroelectric substrate 20. As illustrated in FIG. 1(b) and FIG. 2, the supporting member 30 is provided with a cavity 38, which is rectangularly surrounded by the supporting layer 32. That is, the supporting layer 32 is configured to support the pyroelectric substrate 20 from the back side in an area other than the cavity 38. The pyroelectric substrate 20 warps in a cavity-facing region 26 thereof opposite the cavity 38.

The front-side metal layer 40 is formed on the front side of the pyroelectric substrate 20. The front-side metal layer 40 includes two rectangular front-side electrodes 41 and 42 longitudinally extending in plan view, a lead portion 46 electrically connected to the front-side electrode 41 and square in plan view, and a lead portion 47 electrically connected to the front-side electrode 42 and square in plan view. Examples of the material of the front-side metal layer 40 include metals, such as nickel, chromium, and gold. Materials with higher infrared absorptivity are more preferable. The thickness of the front-side metal layer 40 is not particularly limited, but is, for example, 0.01 μm to 0.2 μm. The front-side metal layer 40 may have a double-layer structure composed of a metal layer of chromium formed on the front side of the pyroelectric substrate 20 and a metal layer of nickel formed on the metal layer of chromium. The front-side electrodes 41 and 42 are formed on the cavity-facing region 26, other than the top 27, opposite the cavity 38 such that the top 27 is interposed between the front-side electrodes 41 and 42.

The back-side metal layer 50 is formed on the back side of the pyroelectric substrate 20. The back-side metal layer 50 includes two rectangular back-side electrodes 51 and 52 longitudinally extending in plan view, and a rectangular lead portion 56 electrically connecting the back-side electrodes 51 and 52 and laterally extending in plan view. The material of the back-side metal layer 50 can be the same as that of the front-side metal layer 40 described above. The thickness of the front-side metal layer 40 is not particularly limited, but is, for example, 0.01 μm to 0.2 μm. The back-side electrodes 51 and 52 on the back side of the pyroelectric substrate 20 are located opposite the front-side electrodes 41 and 42, respectively.

The light-receiving section 61 is formed by a pair of electrodes (front-side electrode 41 and back-side electrode 51) and a light-receiving portion 21 of the pyroelectric substrate 20 interposed between the front-side electrode 41 and the back-side electrode 51. Similarly, the light-receiving section 62 is formed by a pair of electrodes (front-side electrode 42 and back-side electrode 52) and a light-receiving portion 22 of the pyroelectric substrate 20 interposed between the front-side electrode 42 and the back-side electrode 52. In the light-receiving sections 61 and 62, a voltage between the pair of electrodes changes when the temperature is changed by irradiation of infrared light. For example, when the light-receiving section 61 is irradiated with infrared light, the front-side electrode 41 and the light-receiving portion 21 absorb the infrared light. This causes a change in temperature. Then, the resulting change in spontaneous polarization in the light-receiving portion 21 appears as a change in voltage between the front-side electrode 41 and the back-side electrode 51.

Figure 3:
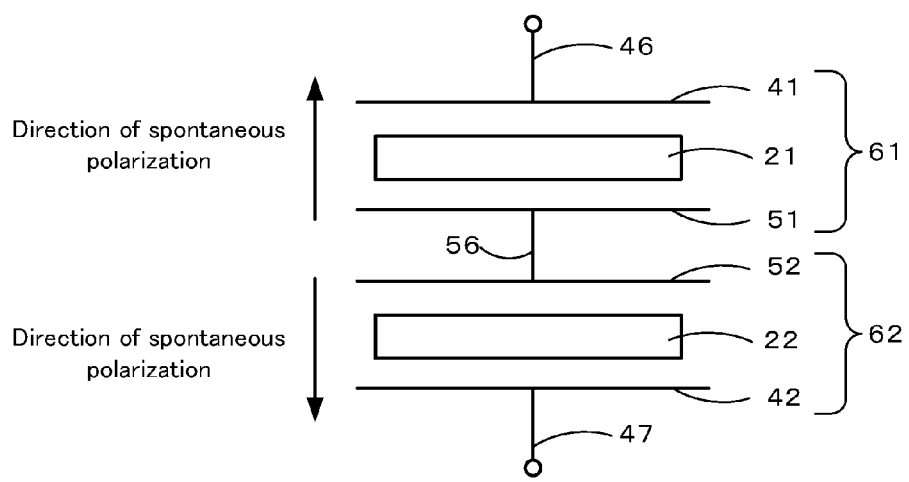
FIG. 3 is a circuit diagram illustrating how light-receiving sections 61 and 62 of the pyroelectric element 10 are electrically connected.

The operation of the pyroelectric element 10 configured as described above will now be described. FIG. 3 is a circuit diagram illustrating how the light-receiving sections 61 and 62 of the pyroelectric element 10 are electrically connected. As illustrated, the light-receiving sections 61 and 62 of the pyroelectric element 10 are connected, in series, by connection of the back-side electrodes 51 and 52 through the lead portion 56. A voltage between the front-side electrodes 41 and 42 at both ends of the serially-connected circuit can be extracted as a voltage between the lead portions 46 and 47. In the present embodiment, the directions of spontaneous polarization in the light-receiving portions 21 and 22 are opposite each other in FIG. 3 (whereas they are the same in FIG. 1(b)). In the pyroelectric element 10, where the pyroelectric substrate 20 is made of pyroelectric material, spontaneous polarization always takes place in the light-receiving portions 21 and 22 even under normal conditions. However, since the light-receiving sections 61 and 62 absorb floating electric charge in the air to be electrically balanced with the spontaneous polarization, apparent electric charge is zero in both the light-receiving portions 21 and 22. Therefore, since no voltage is generated between the front-side electrode 41 and the back-side electrode 51 and between the front-side electrode 42 and the back-side electrode 52 under normal conditions, no voltage is generated between the lead portions 46 and 47. If a change in the amount of infrared light in the atmosphere surrounding the pyroelectric element 10 (e.g., a change in ambient temperature) causes the temperatures of the light-receiving portions 21 and 22 to change in the same manner, a change in spontaneous polarization occurs in both the light-receiving portions 21 and 22. This results in an imbalance of electric charge and causes voltages of equal magnitude to be generated between the front-side electrode 41 and the back-side electrode 51 and between the front-side electrode 42 and the back-side electrode 52. However, since the directions of spontaneous polarization in the light-receiving portions 21 and 22 are opposite each other as illustrated in FIG. 3, the voltages cancel out each other and again no voltage is generated between the lead portions 46 and 47. Thus, the pyroelectric element 10 is a dual-type element in which the light-receiving sections 61 and 62 are connected in series such that the directions of spontaneous polarization are opposite each other. Therefore, not only under normal conditions but also when there is a change in the amount of infrared light in the atmosphere surrounding the pyroelectric element 10, no voltage is generated between the lead portions 46 and 47 and a malfunction caused by noise is less likely to occur. On the other hand, for example, when someone passes by the pyroelectric element 10 and the light-receiving sections 61 and 62 are irradiated with different amounts of infrared light, the temperatures of the light-receiving portions 21 and 22 are changed by different amounts. Because of these temperature changes, a voltage generated between the front-side electrode 41 and the back-side electrode 51 is different from a voltage generated between the front-side electrode 42 and the back-side electrode 52. Since these voltages do not completely cancel out each other, a voltage is generated between the lead portions 46 and 47. When the light-receiving portions of a sensor are flat, an amount of infrared light falling on one light receiving section 61 may be equal to that falling on another light-receiving section 62 in rare cases depending on a position and a speed of a human passing in front of the sensor. In such a case, the sensor fails to react and malfunctions. On the other hand, when light-receiving portions of a sensor warp and arch, it is difficult for either light-receiving, which is farther from a human than the other, to receive infrared light. This is likely to cause an imbalance between the light-receiving sections 61 and 62. As a result, an occurrence of malfunction that the sensor does not react to a human coming closer is reduced. Thus, the pyroelectric element 10 can be used as an infrared detector for human detection, fire detection, etc. When the pyroelectric element 10 is used as an infrared detector, for example, a voltage between the lead portions 46 and 47 can be amplified by connecting the lead portions 46 and 47 to a field-effect transistor (FET) for impedance conversion. The front-side electrodes 41 and 42 may be covered with an infrared absorbing layer of gold black to improve the infrared absorption efficiency. To prevent a malfunction caused by noise, the front-side electrodes 41 and 42 may be provided with a wavelength filter that allows light of only a specific wavelength to reach the light-receiving portions 21 and 22.

In the present embodiment, the pyroelectric substrate 20 of the pyroelectric element 10 warps in the cavity-facing region 26 opposite the cavity 38. Therefore, the light-receiving area of the light-receiving sections 61 and 62 is larger than that in the case where there is no warp. When the light-receiving area increases, even if the amount of infrared light applied is the same, there will be an increase in the amount of electric charge generated in the light-receiving portions 21 and 22 by spontaneous polarization and a high voltage will be generated. Thus, it is possible to improve detection sensitivity of the pyroelectric element 10 without making the size of the pyroelectric element 10 larger than that in the case where there is no warp.

The pyroelectric substrate 20 is thinner at the top 27 of the warp than at the rest, the top 27 being located between the light-receiving sections 61 and 62. Therefore, as compared to the case where the thickness of the pyroelectric substrate 20 at the top 27 is the same as that at the rest, easy heat conduction between the light-receiving sections 61 and 62 is less likely to occur. If heat conduction between the light-receiving sections 61 and 62 easily occurs, even when the light-receiving sections 61 and 62 are irradiated with different amounts of infrared light, the temperatures of the light-receiving portions 21 and 22 may change by the same amount, due to heat conduction from one to the other of the light-receiving sections 61 and 62. Then, as in the case where the amount of background infrared light changes, a voltage between the front-side electrode 41 and the back-side electrode 51 and a voltage between the front-side electrode 42 and the back-side electrode 52 cancel out each other and a voltage between the lead portions 46 and 47 is reduced. As a result, the pyroelectric element 10 may fail to operate when it should. In the pyroelectric element 10 of the present embodiment where the pyroelectric substrate 20 is thin at the top 27, easy heat conduction between the light-receiving sections 61 and 62 is less likely to occur. Thus, the pyroelectric element 10 can be prevented from failing to operate when it should, and improved detection sensitivity can be achieved.

Additionally, if the supporting member 30 is made of materials having thermal conductivities lower than that of the material of the pyroelectric substrate 20, heat does not easily escape from the pyroelectric substrate 20 to the supporting member 30. This means that the temperatures of the light-receiving portions 21 and 22 change easily. Thus, even when there is only a slight change in the amount of infrared light, the resulting changes in temperature cause a voltage to be generated between the front-side electrode 41 and the back-side electrode 51 and between the front-side electrode 42 and the back-side electrode 52. The detection sensitivity of the pyroelectric element 10 can thus be improved.

Figure 4:
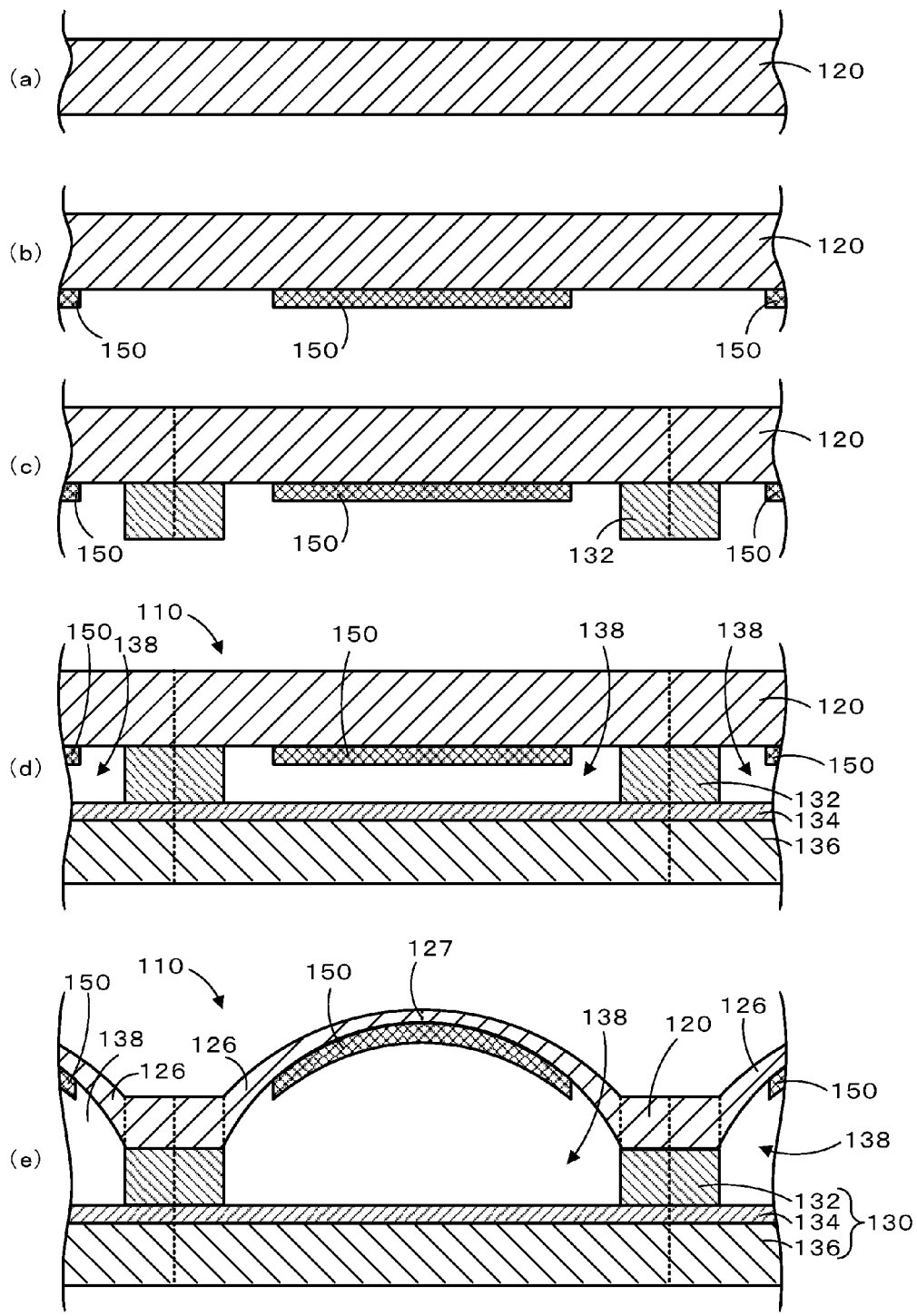
FIG. 4(a) to FIG. 4(e) are cross-sectional views schematically illustrating a process of manufacturing the pyroelectric element 10.
Figure 5:
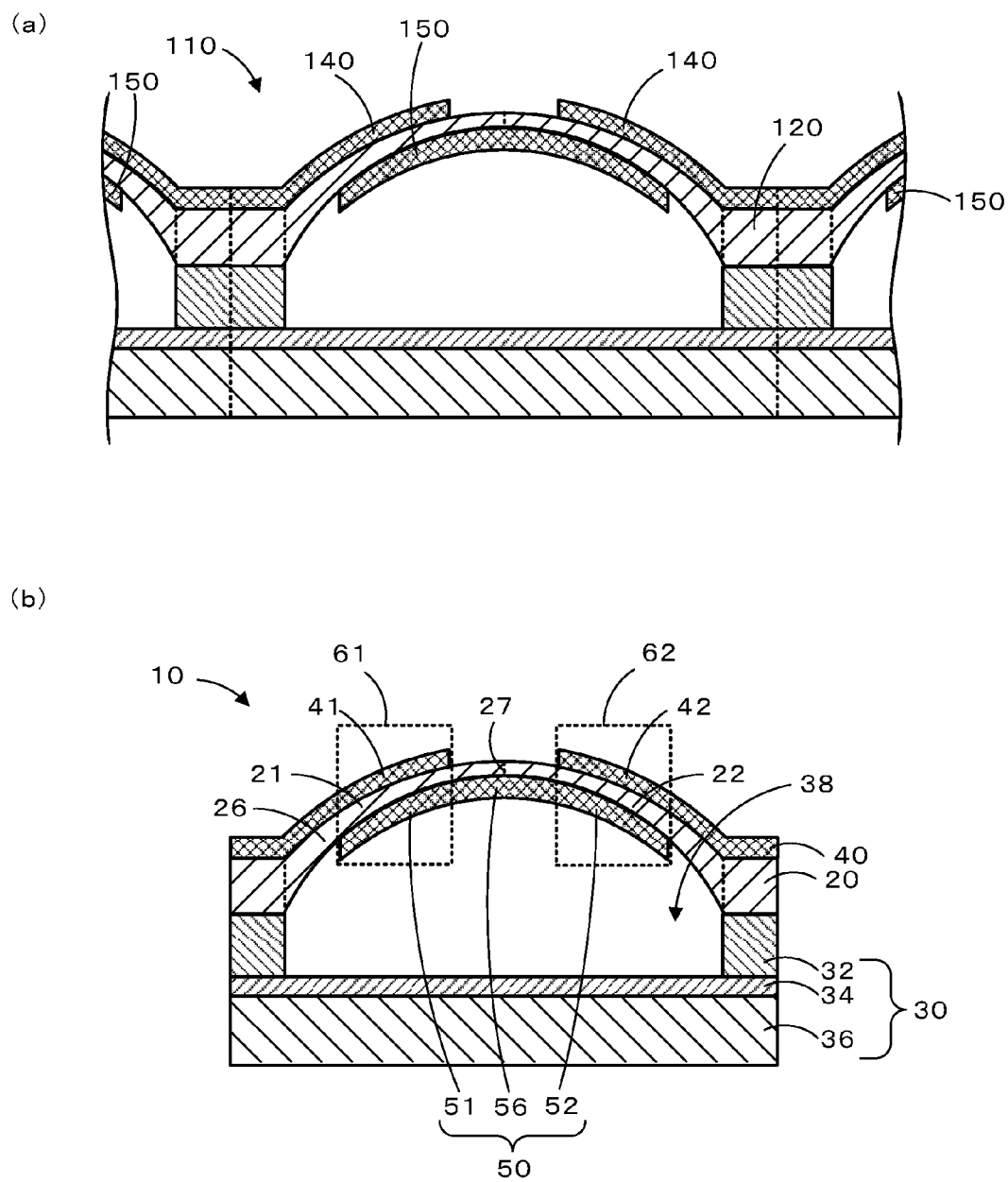
FIG. 5(a) and FIG. 5(b) are cross-sectional views schematically illustrating the process of manufacturing the pyroelectric element 10.

A method for manufacturing the pyroelectric element 10 will now be described. FIG. 4 and FIG. 5 are cross-sectional views schematically illustrating steps of manufacturing the pyroelectric element 10. First, a flat pyroelectric substrate 120 to be turned into individual pyroelectric substrates 20 is prepared (see FIG. 4(a)). For example, the pyroelectric substrate 120 is a wafer that has an orientation flat (OF) and is large enough to allow a plurality of pyroelectric substrates 20 to be cut out therefrom. The material of the pyroelectric substrate 120 can be the same as that of the pyroelectric substrate 20 described above. The size of the pyroelectric substrate 120 is not particularly limited, but is, for example, 50 mm to 100 mm in diameter and 200 μm to 500 μm in thickness.

Next, back-side metal layers 150 to be turned into individual back-side metal layers 50 are formed on the back side of the pyroelectric substrate 120 (see FIG. 4(b)). The back-side metal layers 150 are obtained by forming a pattern, which is to be turned into a plurality of back-side metal layers 50, on the back side of the pyroelectric substrate 120. The material of the back-side metal layers 150 can be the same as that of the back-side metal layer 50 described above. The thickness of the back-side metal layers 150 is not particularly limited, but is, for example, 0.01 μm to 0.2 μm. The back-side metal layers 150 can be formed, for example, by vacuum evaporation using a metal mask that covers the pyroelectric substrate 120 except for areas of the back-side metal layers 150. The back-side metal layers 150 may be formed by sputtering, photolithography, or screen printing.

Next, supporting layers 132 to be turned into individual supporting layers 32 are formed on the back side of the pyroelectric substrate 120 (see FIG. 4(c)). The supporting layers 132 are obtained by forming a pattern, which is to be turned into a plurality of supporting layers 32, on the back side of the pyroelectric substrate 120 such that cavities 38 are created. The positional relationship between the back-side metal layers 150 and the supporting layers 132 is the same as that between the back-side metal layer 50 and the supporting layer 32 illustrated in FIG. 1 and FIG. 2. The material of the supporting layers 132 can be the same as that of the supporting layer 32 described above. The thickness of the supporting layers 132 is not particularly limited, but is, for example, 0.1 μm to 1 μm. The supporting layers 132 are formed, for example, in the following manner. First, a layer to be turned into the supporting layers 132 is formed by sputtering over the entire back side of the pyroelectric substrate 120. Next, a resist film serving as an etching mask is formed on the layer by photolithography only at portions to be left as the supporting layers 132. Then, portions not covered by the etching mask (i.e., the portions to be turned into individual cavities 38) are removed by etching. The supporting layers 132 are thus formed.

Next, a supporting substrate 136 to be turned into individual supporting substrates 36 is prepared. An adhesive for forming bonding layers 34 is applied to the front side of the supporting substrate 136 and/or the back sides of the supporting layers 132. After the front side of the supporting substrate 136 is bonded to the back sides of the supporting layers 132, the adhesive is cured to form a bonding layer 134 (see FIG. 4(d)). Thus, a composite body 110 can be obtained, which includes the pyroelectric substrate 120, the back-side metal layers 150, the supporting layers 132, the bonding layer 134, and the supporting substrate 136 and has cavities 138 to be turned into individual cavities 38. The material of the bonding layer 134 can be the same as that of the bonding layer 34 described above. The thickness of the bonding layer 134 is not particularly limited, but is, for example, 0.1 μm to 1 μm.

Until the pyroelectric substrate 120 of the composite body 110 warps, the front side of the pyroelectric substrate 120 is ground (see FIG. 4(e)). In the composite body 110 of FIG. 4(d), when the front side of the pyroelectric substrate 120 is ground and the pyroelectric substrate 120 is thinned to a certain level, the pyroelectric substrate 120 warps in cavity-facing regions 126 opposite the cavities 138. This will be caused by residual stress generated in the back-side metal layers 150 when the back-side metal layers 150 are formed on the pyroelectric substrate 120. That is, when the pyroelectric substrate 120 is thinned down, the back-side metal layers 150 and the pyroelectric substrate 120 will be warped by residual stress. The pyroelectric substrate 120 warps only in the cavity-facing regions 126 opposite the cavities 138, and does not warp at any portions supported by the supporting layers 132. If the back-side metal layers 150 are not at all formed at any portions opposite the cavities 138, the pyroelectric substrate 120 again does not warp. For grinding until a warp occurs, although not particularly limited, the pyroelectric substrate 120 may be ground, for example, to a thickness of 0.1 µm to 10 µm in the cavity-facing regions 126 opposite the cavities 138. The thickness to which the pyroelectric substrate 120 is to be ground (or the length of grinding time) can be defined, in advance, by an experiment that involves grinding the pyroelectric substrate 120 of the composite body 110 and determining the thickness to which the pyroelectric substrate 120 is to be ground to allow the pyroelectric substrate 120 to warp.

The grinding continues after the pyroelectric substrate 120 is thinned to a thickness at which the pyroelectric substrate 120 warps to protrude on the front side thereof, in the cavity-facing regions 126. Thus, the closer the tops 127 of the warps, the more easily it becomes to grind the front side of the pyroelectric substrate 120. As illustrated in FIG. 4(e), the pyroelectric substrate 120 is thinner toward the tops 127 of the warps, so that the pyroelectric substrate 120 is thinner at the tops 127 than at the rest.

After the pyroelectric substrate 120 is ground, front-side metal layers 140 to be turned into individual front-side metal layers 40 are formed on the front side of the pyroelectric substrate 120 (see FIG. 5(a)). The front-side metal layers 140 are obtained by forming a pattern, which is to be turned into a plurality of front-side metal layers 40, on the front side of the pyroelectric substrate 120. The front-side metal layers 140 are formed such that portions thereof to be turned into the front-side electrodes 41 and 42 are paired with respective portions to be turned into the back-side electrodes 51 and 52. The material of the front-side metal layers 140 can be the same as that of the front-side metal layer 40 described above. The thickness of the front-side metal layers 140 is not particularly limited, but is, for example, 0.01 µm to 0.2 µm. The front-side metal layers 140 can be formed in the same manner as the back-side metal layers 150. The composite body 110 thus is a collection of many pyroelectric elements 10.

Then, individual pyroelectric elements 10 are cut out of the composite body 110 having the front-side metal layers 140 formed thereon (FIG. 5(b)). Thus, a plurality of pyroelectric elements 10, one of which is illustrated in FIG. 1 and FIG. 2, can be obtained.

It will be obvious that the present invention is not limited to the embodiments described above, and may be implemented in various ways within the technical scope of the present invention.

Figure 6:
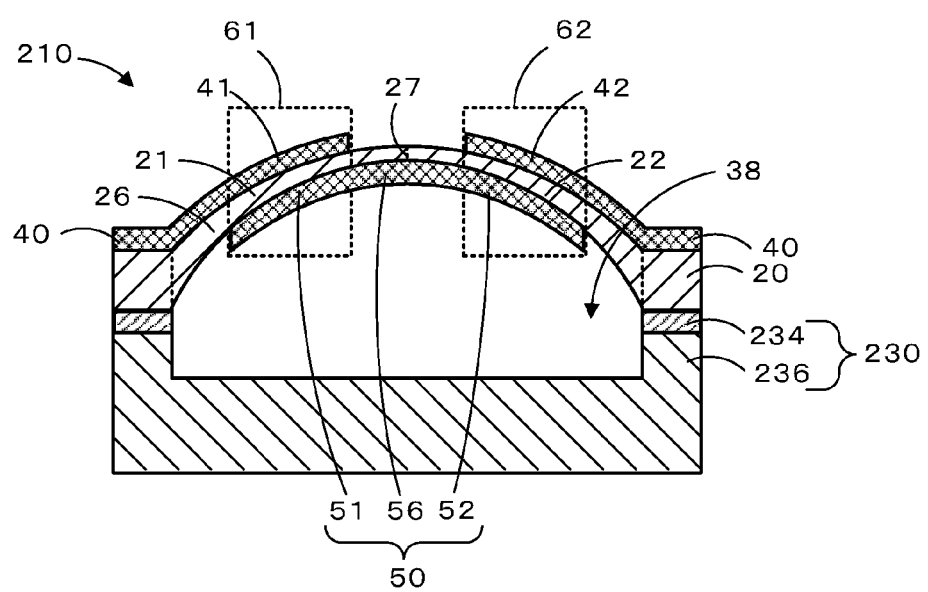
FIG. 6 is a cross-sectional view of a pyroelectric element 210 according to a modification.

For example, the supporting member 30 includes the supporting layer 32, the bonding layer 34, and the supporting substrate 36 in the embodiment described above. However, the supporting member 30 may have any configuration, as long as it has the cavity 38 and supports the pyroelectric substrate 120 from the back side at a portion other than the cavity 38. For example, the supporting member 30 may not include the supporting layer 32, and may include only the bonding layer 34 and the supporting substrate 36. A pyroelectric element 210 according to this modification is illustrated in FIG. 6. In FIG. 6, the same components as those of the pyroelectric element 10 illustrated in FIG. 1 and FIG. 2 are given the same reference numerals and their description will be omitted. As illustrated, a supporting member 230 in the pyroelectric element 210 includes a bonding layer 234 and a supporting substrate 236 bonded to the back side of the pyroelectric substrate 20 by the bonding layer 234. The supporting member 230 and the supporting member 30 illustrated in FIG. 1 are different in components, but identical in shape. The bonding layer 234 and the supporting substrate 236 can be made of the same materials as the bonding layer 34 and the supporting substrate 36 described above. The supporting substrate 236 has a recessed portion, which forms the cavity 38. The supporting substrate 236 supports the pyroelectric substrate 20 from the back side at a portion other than the cavity 38. With this configuration, it is still possible to achieve an effect similar to that of the pyroelectric element 10 of the present embodiment. The pyroelectric element 210 can be manufactured, for example, in the following manner. First, the same steps as those illustrated in FIG. 4(a) and FIG. 4(b) are performed. Next, instead of performing the steps of FIG. 4(c) and FIG. 4(d), a flat supporting substrate to be turned into the supporting substrate 236 is prepared. Then, a resist film serving as an etching mask is formed by photolithography only at portions to be left as the supporting substrate 236. Then, portions not covered by the etching mask (i.e., the portions each being to be turned into the cavity 38) are removed by etching. Next, the supporting substrate 236 is bonded to the pyroelectric substrate 120 by an adhesive, which is to be turned into the bonding layer 234, to form a composite body. Then, the pyroelectric element 210 illustrated in FIG. 6 is obtained by steps similar to those of FIG. 4(e), FIG. 5(a), and FIG. 5(b).

The cavity 38 is rectangularly surrounded by the supporting layer 32 in the embodiment described above. However, the cavity 38 may be of any shape, as long as the supporting member 30 supports the pyroelectric substrate 20 from the back side at the portion other than the cavity 38, and the light-receiving sections 41 and 42 are formed at portions of the pyroelectric substrate 20 opposite the cavity 38. For example, the cavity 38 may be circularly surrounded by the supporting layer 32, or may not be completely surrounded by the supporting layer 32 and may partially face the periphery of the pyroelectric element 10.

Although the pyroelectric element 10 is a dual-type pyroelectric element in the embodiment described above, the pyroelectric element 10 may be a single-type pyroelectric element that includes only one light-receiving section, or may be a quad-type pyroelectric element that includes four light-receiving sections. If the pyroelectric element 10 is a quad-type pyroelectric element, at least two of four light-receiving sections may be formed such that the top 27 of the warp is interposed therebetween. Thus, since the pyroelectric substrate 20 is thin at the top 27 interposed between the two light-receiving sections, easy heat conduction between the two light-receiving sections is less likely to occur. The configurations of front-side and back-side electrodes of a single-type pyroelectric element or a quad-type pyroelectric element are described, for example, in Japanese Unexamined Patent Application Publication No. 2006-203009.

In the embodiment described above, the pyroelectric substrate warps to protrude on the front side thereof in the cavity-facing region 26. However, the pyroelectric substrate may warp to protrude on the back side thereof. In this case, it is still possible to increase the surface area of the light-receiving sections 61 and 62.

Figure 7:
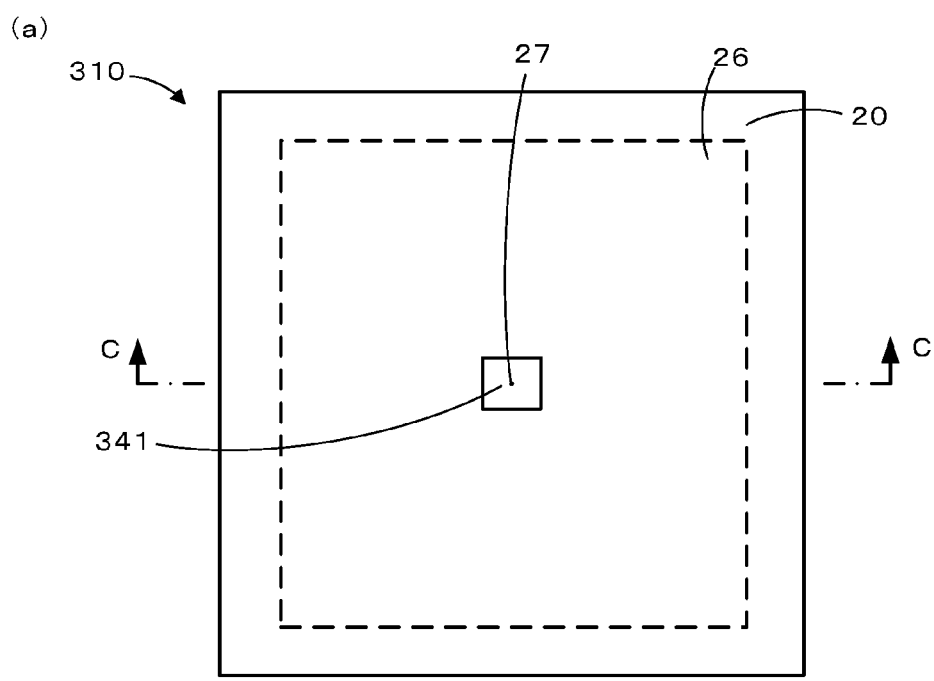
FIG. 7(a) and FIG. 7(b) are a plan view and a cross-sectional view, respectively, of a pyroelectric element 310 according to another modification.
Figure 7:
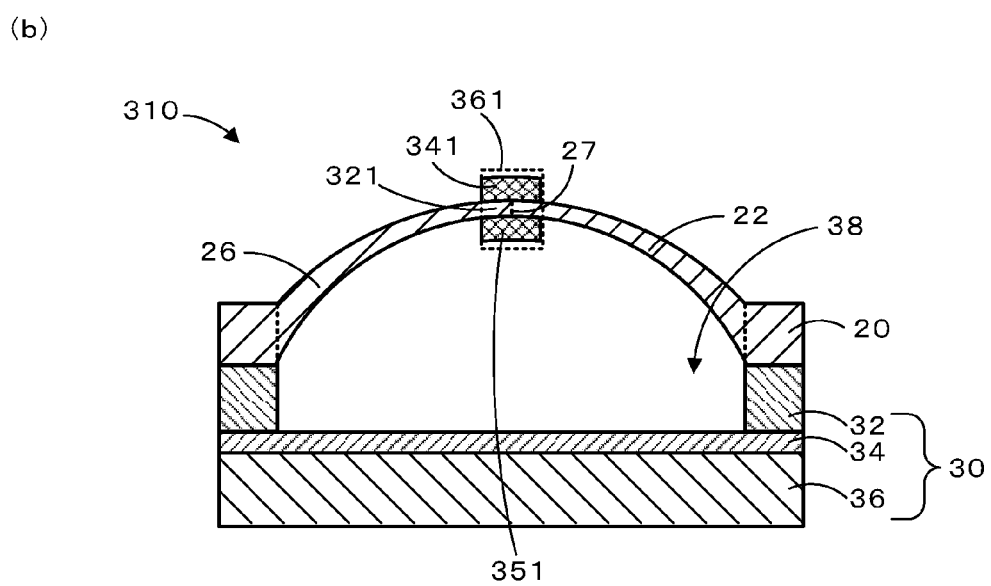

In the present embodiment described above, the light-receiving sections 61 and 62 are located at portions of the pyroelectric substrate 20 opposite the cavity 38, the portions being other than the top 27, such that the top 27 is interposed between the light-receiving sections 61 and 62. However, the locations of the light-receiving sections 61 and 62 are not limited to this, and the light-receiving sections 61 and 62 may be located anywhere opposite the cavity 38. In this case, if the pyroelectric substrate 20 warps in the cavity-facing region 26, it is still possible to increase the light-receiving area of the light-receiving sections 61 and 62 and improve the detection sensitivity. A light-receiving section may be formed at the top 27. A pyroelectric element 310 according to this modification is illustrated in FIG. 7. FIG. 7(a) is a plan view of the pyroelectric element 310, and FIG. 7(b) is a cross-sectional view taken along line C-C of FIG. 7(a). In FIG. 7, the same components as those of the pyroelectric element 10 illustrated in FIG. 1 are given the same reference numerals and their description will be omitted. As illustrated, a light-receiving section 361 in the pyroelectric element 310 is formed by a pair of electrodes (front-side electrode 341 and back-side electrode 351) and a light-receiving portion 321 of the pyroelectric substrate 20 interposed between the front-side electrode 341 and the back-side electrode 351. The front-side electrode 341 is formed on the front side of the pyroelectric substrate 20 including the top 27, and the back-side electrode 351 is formed on the back side of the pyroelectric substrate 27 such that the back-side electrode 351 is located opposite the front-side electrode 341. That is, the light-receiving section 361 is formed at the top 27. The pyroelectric element 310 may be used as a single-type pyroelectric element that includes one light-receiving section 361, or may be used as a dual-type or quad-type pyroelectric element that combines a plurality of pyroelectric elements 310. In the pyroelectric element 310, the light-receiving section 361 is formed at the top 27 of the pyroelectric substrate 20. Unlike in the case where the entire pyroelectric substrate 20 is thinned to the same thickness as that at the top 27, it is possible to prevent degradation in mechanical strength of the pyroelectric element 310. At the same time, since the light-receiving section 361 is thin and thus is low in thermal capacity, high detection sensitivity of the pyroelectric element 310 can be achieved. In the pyroelectric element 310, to facilitate connection between the light-receiving section 361 and other circuits, lead portions similar to the lead portions 46 and 47 illustrated in FIG. 1 and FIG. 2 may be formed on the front and back sides of the pyroelectric substrate 20.

Figure 8:
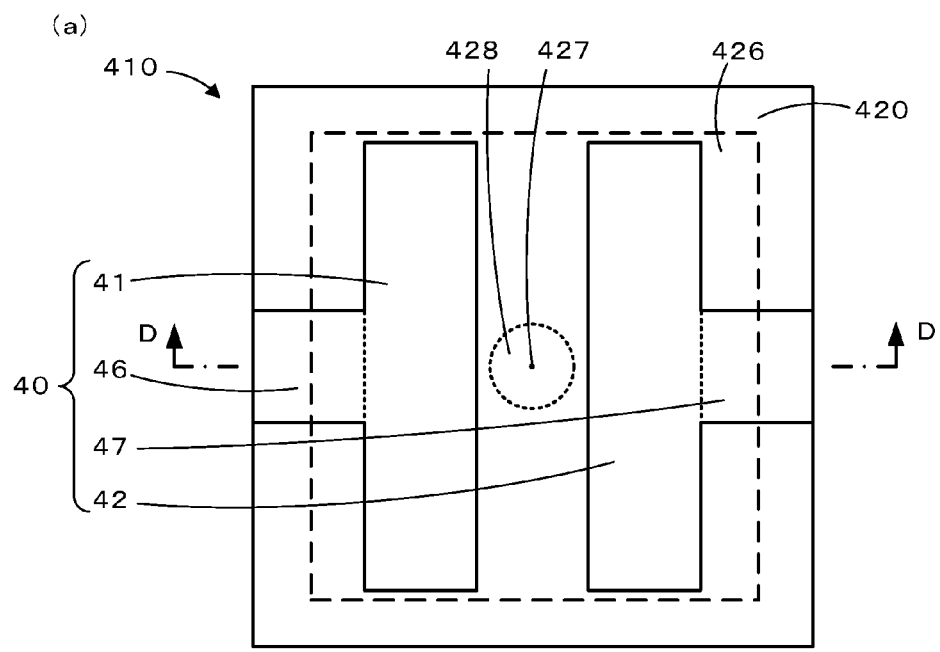
FIG. 8(a) and FIG. 8(b) are a plan view and a cross-sectional view, respectively, of a pyroelectric element 410 according to another modification.
Figure 8:
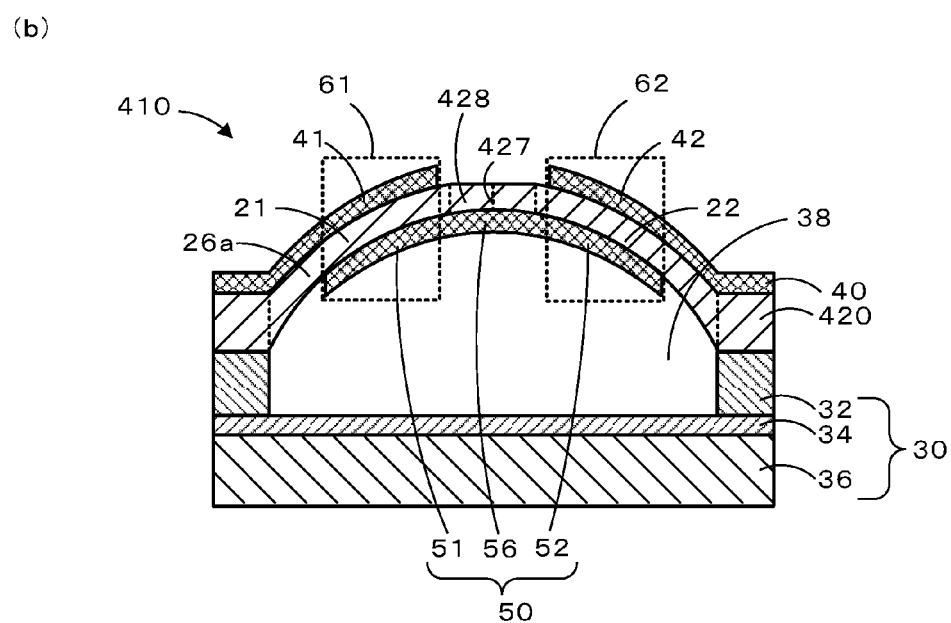

In the embodiment described above, the pyroelectric substrate 20 is thinner toward the top 27 of the warp. However, it may be good that the pyroelectric substrate 20 is thinner at the top 27 than at the rest. For example, the pyroelectric substrate 20 may be thinner only in a region including the top 27 and its surrounding area, and the rest of the pyroelectric substrate 20 may be uniform in thickness. FIG. 8(a) is a plan view of a pyroelectric element 410 according to this modification. FIG. 8(b) is a cross-sectional view taken along line D-D of FIG. 8(a). In the pyroelectric element 410 of FIG. 8, the same components as those of the pyroelectric element 10 illustrated in FIG. 1 are given the same reference numerals and their description will be omitted. In the pyroelectric element 410, as illustrated, a pyroelectric substrate 420 is thinner only in a region 428 of a cavity-facing region 426 opposite the cavity 38, the region 428 including a top 427 and its surrounding area. Again, since the pyroelectric substrate 20 is thin at the top 427 interposed between the two light-receiving sections 61 and 62, easy heat conduction between the light-receiving sections 61 and 62 is less likely to occur.

EXAMPLES

Example 1

The pyroelectric element 10 illustrated in FIG. 1 and FIG. 2 was made, as Example 1, by the manufacturing method described with reference to FIG. 4 and FIG. 5. First, a lithium tantalate (LT) substrate having an orientation flat (OF) portion was prepared as the pyroelectric substrate 120 (see FIG. 4(a)). The LT substrate is 4 inches in diameter and 350 μm in thickness. A 42°-Y-offcut plate was used as the LT substrate. Next, the back-side metal layers 150 of nickel and chromium were formed on the back side of the pyroelectric substrate 120 (see FIG. 4(b)). The back-side metal layers 150 were formed by vacuum evaporation using a metal mask that covers the pyroelectric substrate 120 except for areas of the back-side metal layers 150. The vacuum evaporation first involved depositing a chromium film at a rate of 5 Å/s until a thickness of 0.02 μm was reached, and depositing a nickel film at a rate of 10 Å/s until a thickness of 0.1 μm was reached. The pressure during film deposition in the vacuum evaporation was $2.7 \times 10^{-4}$ Pa, and the temperature of the pyroelectric substrate 120 was about 100° C. Thus, the back-side metal layers 150 having a thickness of 0.12 μm were formed. The pattern of the back-side metal layers 150 was formed such that each of the back-side electrodes 51 and 52 was 2 mm in length and 0.5 mm in width, and that the lead portion 56 was 0.1 mm in length and 0.5 mm in width.

Next, the supporting layers 132 of silicon dioxide were formed on the back side of the pyroelectric substrate 120 (see FIG. 4(c)). Specifically, first, a 0.5-μm-thick silicon dioxide film was formed by sputtering over the entire back side of the pyroelectric substrate 120. Next, a resist film (or positive photosensitive resist, OFPR-800LB, manufactured by Tokyo Ohka Kogyo Co., Ltd.) serving as an etching mask was formed on the silicon dioxide film by photolithography only at portions to be left as the supporting layers 132. Then, by immersion in a fluorine solution for five minutes, 2.1 mm by 2.1 mm portions to be turned into individual cavities 38 were removed from the silicon dioxide film. The supporting layers 132 were thus obtained.

Next, a glass substrate having an OF portion was prepared as the supporting substrate 136. The glass substrate is 4 inches in diameter and 500 μm in thickness. Next, a 1-μm-thick coating of epoxy adhesive was applied to the front side of the supporting substrate 136 and the back sides of the supporting layers 132. Then, the front side of the supporting substrate 136 was bonded to the back sides of the supporting layers 132. After the thickness of the epoxy adhesive was reduced to 0.1 μm by press bonding, the pyroelectric substrate 120, the supporting layers 132, and the supporting substrate 136 bonded together were left for one hour under an environment of 200° C. The epoxy adhesive was thus cured to form the composite body 110 (see FIG. 4(d)). Thus, the epoxy adhesive was turned into the bonding layer 134 and the cavities 138 each having a length of 2.1 mm, a width of 2.1 mm, and a depth of 0.5 μm were obtained.

Next, the back side of the supporting substrate 136 was secured by bonding to a grinding jig of silicon carbide. The front side of the pyroelectric substrate 120 was ground by a grinder with fixed abrasive grains until the thickness of the pyroelectric substrate 120 reached 50 μm. The front side of the pyroelectric substrate 120 was further ground with diamond abrasive grains until the thickness of the pyroelectric substrate 120 reached 10 μm. Then, to remove an affected layer formed on the pyroelectric substrate 120 by grinding with diamond abrasive grains, final grinding was performed using loose abrasive grains and a non-woven grinding pad. The pyroelectric substrate 120 was ground to a thickness of 5.00 μm (see FIG. 4(e)).

After the pyroelectric substrate 120 was ground as described above, the front-side metal layers 140 were formed on the front side of the pyroelectric substrate 120 (see FIG.

5(a)). This process was carried out using the same materials and under the same conditions as those for forming the back-side metal layers 150. The pattern of the front-side metal layers 140 was formed such that each of the front-side electrodes 41 and 42 was 2 mm in length and 0.5 mm in width, and that each of the lead portions 46 and 47 was 0.5 mm in length and 0.5 mm in width. After the formation of the front-side metal layers 140, the pyroelectric elements 10 each having a length of 2.5 mm and a width of 2.5 mm were cut out of the composite body 110 by dicing (see FIG. 5(b)). Thus, 1000 pyroelectric elements 10, one of which is illustrated in FIG. 1 to FIG. 3, were obtained as pyroelectric elements of Example 1.

Example 2

Figure 9:
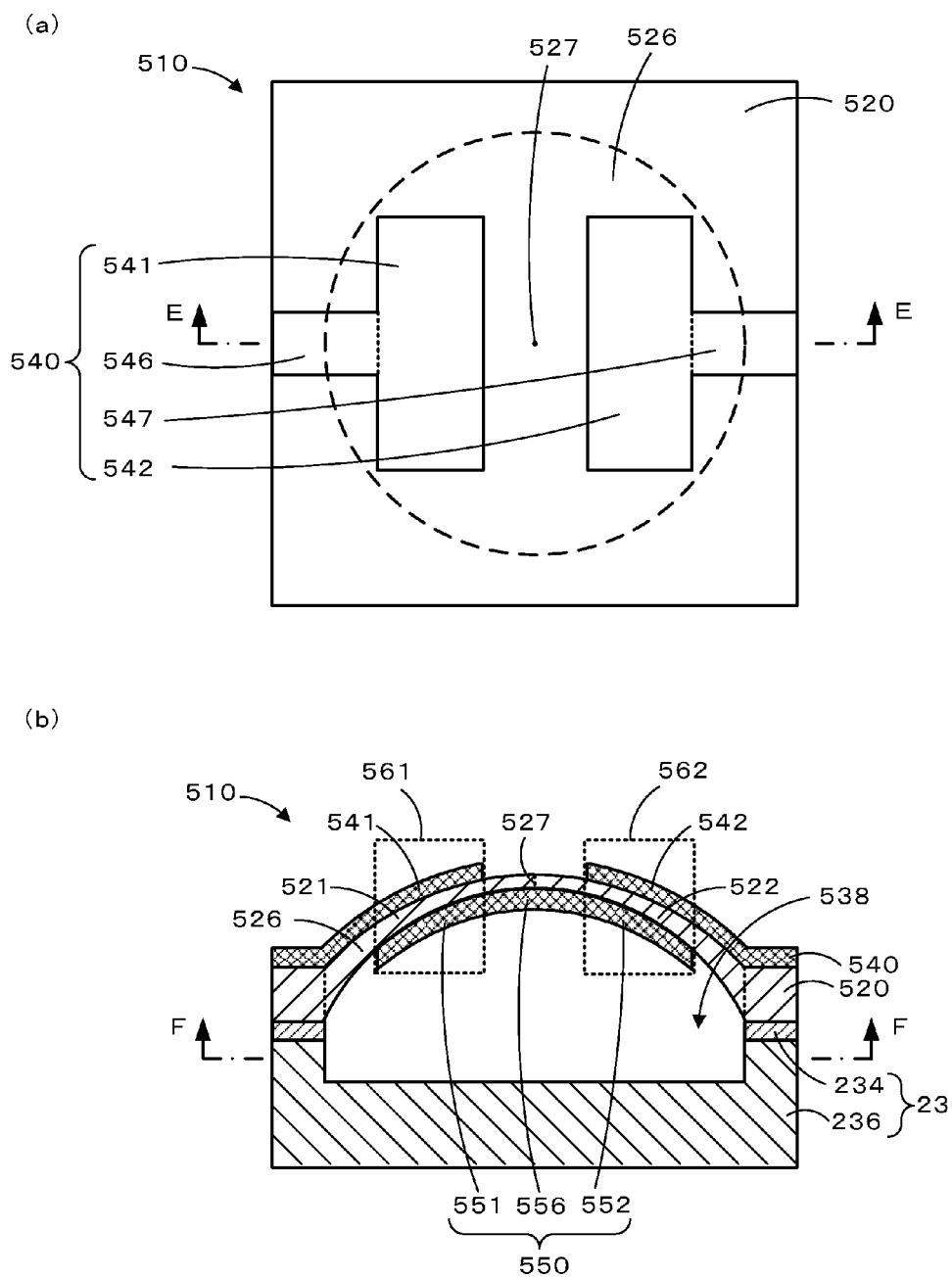
FIG. 9(a) and FIG. 9(b) are a plan view and a cross-sectional view, respectively, of a pyroelectric element 510 according to Example 2.
Figure 10:
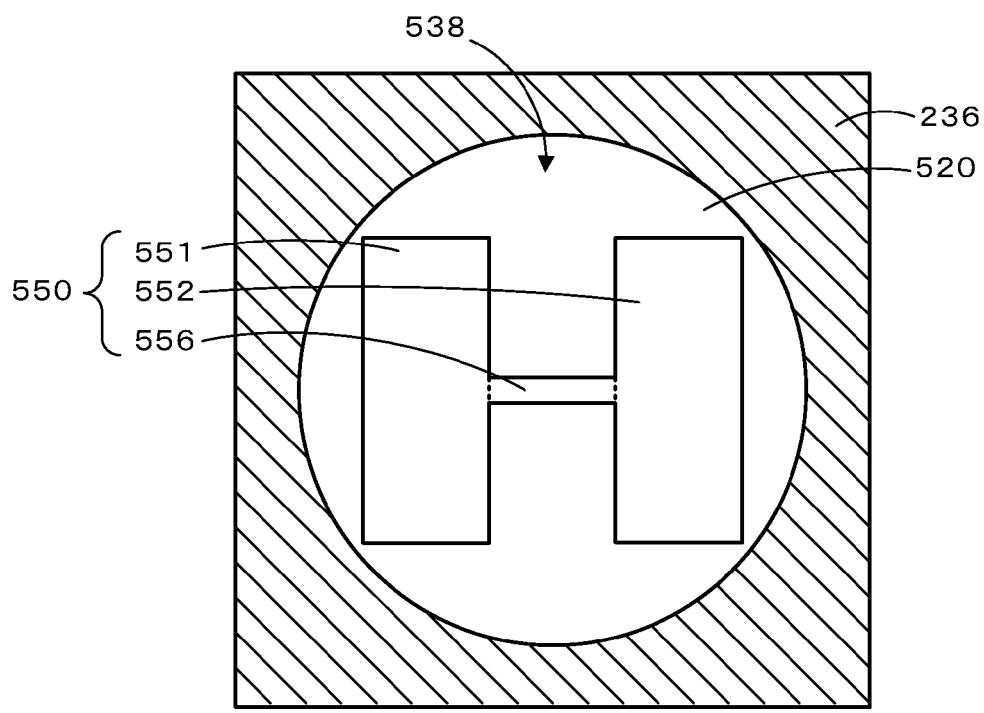
FIG. 10 is a cross-sectional view taken along line F-F of FIG. 9(b).

A pyroelectric element 510 illustrated in FIG. 9 and FIG. 10 was made as Example 2. FIG. 9(a) is a plan view of the pyroelectric element 510, FIG. 9(b) is a cross-sectional view taken along line E-E of FIG. 9(a), and FIG. 10 is a cross-sectional view taken along line F-F of FIG. 9(b). The pyroelectric element 510 is the same as the pyroelectric element 210 illustrated in FIG. 6 except that a cavity 538 is in the shape of a circular cylinder with a diameter of 120 μm, a cavity-facing region 526 opposite the cavity 538 is circular in shape, and front-side electrodes 541 and 542 and back-side electrodes 551 and 552 occupy a smaller area of a pyroelectric substrate 520. Therefore, the same components as those of the pyroelectric element 210 are given the same reference numerals, whereas components corresponding to those of the pyroelectric element 210 are given reference numerals obtained by adding "500" to reference numerals of the corresponding components of the pyroelectric element 210, and their description will be omitted. The size of the pyroelectric element 510 is 0.2 mm in length and 0.2 mm in width. The size of each of the front-side electrodes 541 and 542 is 0.1 mm in length, 0.03 mm in width, and 0.2 μm in thickness. The size of each of the lead portions 546 and 547 is 0.02 mm in length, 0.03 mm in width, and 0.2 μm in thickness. The size of each of the back-side electrodes 551 and 552 is 0.1 mm in length, 0.03 mm in width, and 0.2 μm in thickness.

The pyroelectric element 510 of Example 2 was made in the same manner as Example 1 except that, by the manufacturing method described with reference to FIG. 6 (not by the steps of FIG. 4(c) and FIG. 4(d)), the cavity 538 was formed in the supporting substrate 236 and the supporting substrate 236 was bonded via the bonding layer 234 to the pyroelectric substrate 120 to form a composite body. The cavity 538 was formed in the supporting substrate 236 as in Example 1. That is, a resist film (or positive photosensitive resist, OFPR-800LB, manufactured by Tokyo Ohka Kogyo Co., Ltd.) serving as an etching mask was formed by photolithography only at portions to be left as the supporting substrate 236. Then, by immersion in a fluorine solution for five minutes, portions each having a diameter of 120 μm and a depth of 1 μm and to be turned into the cavity 538 were removed. The supporting substrate 236 was bonded to the pyroelectric substrate 120 in accordance with the same procedure as that for bonding the supporting layers 132 to the supporting substrate 136 in Example 1.

Example 3

The pyroelectric element 10 was made as Example 3. Except that the pyroelectric substrate 120 is a Z-cut plate of lithium niobate (LN), the structure of the pyroelectric element 10 of Example 3 and the procedure for making it are the same as those of Example 1.

Comparative Example 1

Figure 11:
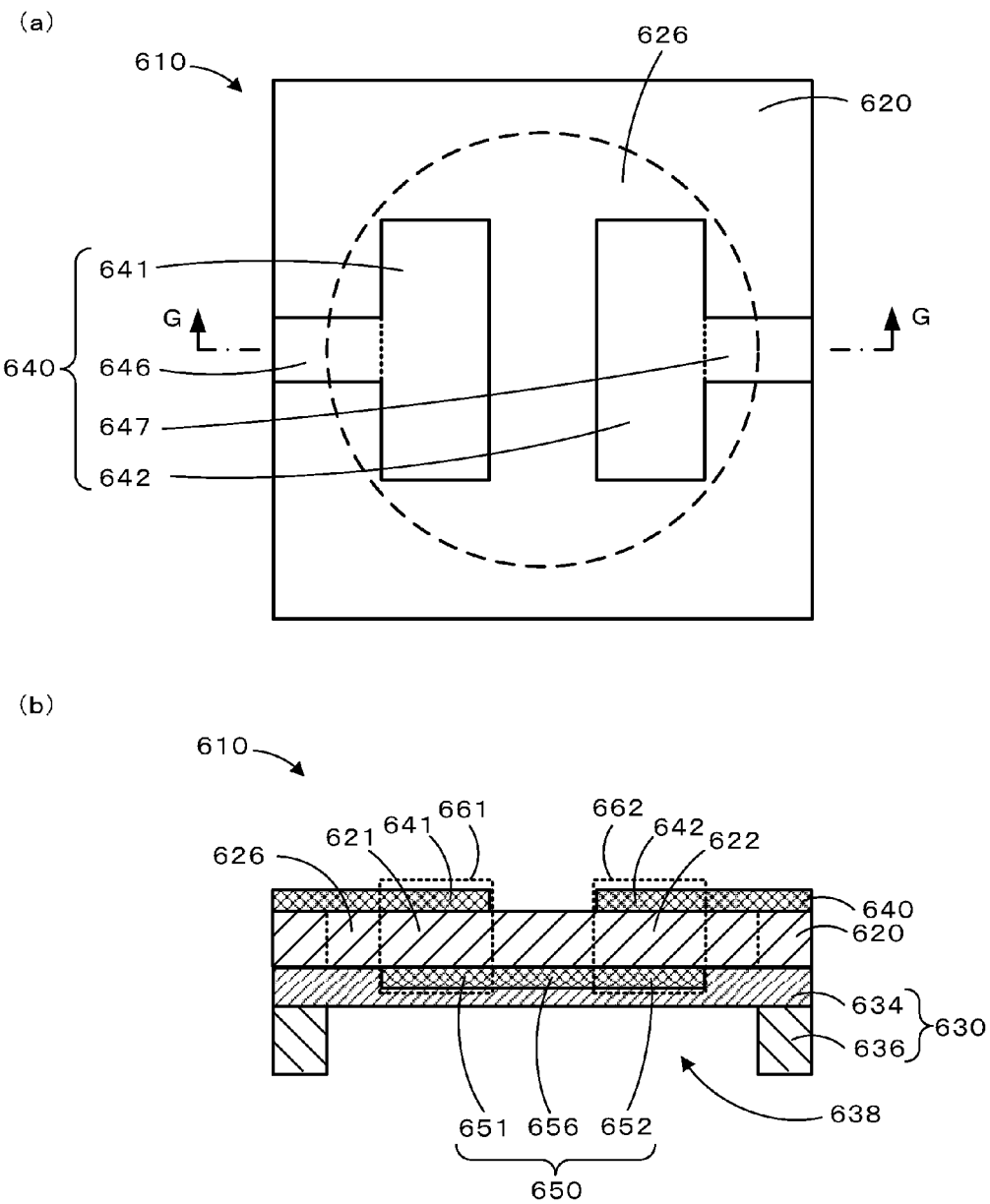
FIG. 11(a) and FIG. 11(b) are a plan view and a cross-sectional view, respectively, of a pyroelectric element 610 according to Comparative Example 1.

A pyroelectric element 610 illustrated in FIG. 11 was made as Comparative Example 1. FIG. 11(a) is a plan view of the pyroelectric element 610, and FIG. 11(b) is a cross-sectional view taken along line G-G of FIG. 11(a). As illustrated in FIG. 11(a), the pyroelectric element 610 has the same configuration in plan view as the pyroelectric element 510 of Example 2. Also, a back-side metal layer 650 has the same shape in plan view as the back-side metal layer 550 illustrated in FIG. 9. Therefore, components corresponding to those of the pyroelectric element 510 are given reference numerals obtained by adding "100" to reference numerals of the corresponding components of the pyroelectric element 510 and their description will be omitted. A supporting member 630 in the pyroelectric element 610 is composed of a bonding layer 634 and a supporting substrate 636. Unlike the bonding layer 234 of the pyroelectric element 310, the bonding layer 634 is formed over the entire back side of a pyroelectric substrate 620. Therefore, the back-side metal layer 650 is not exposed, as it is surrounded by the pyroelectric substrate 620 and the bonding layer 634. Unlike the supporting substrate 236 of the pyroelectric element 310, the supporting substrate 636 has a hole formed from below, as illustrated in FIG. 11(b). This hole is a cavity 638.

The pyroelectric element 610 of Comparative Example 1 was made as follows. First, as in Example 2, the back-side metal layer 650 was formed on the pyroelectric substrate 620 in a manner similar to that illustrated in FIG. 4(a) and FIG. 4(b). Next, a flat supporting substrate to be turned into the supporting substrate 636 was prepared. Then, the front side of the supporting substrate was bonded to the back side of the pyroelectric substrate 620 by an adhesive to be turned into the bonding layer 634, and thus a composite body was obtained. Next, as in Example 1, the pyroelectric substrate 620 was ground to a thickness of 5.00 μm. Then, a resist film serving as an etching mask was formed on the back side of the supporting substrate by photolithography only at portions to be left as the supporting substrate 636. Then, portions not covered by the etching mask were removed by etching to obtain the supporting substrate 636. Each of the removed portions was thus formed as the cavity 638. Next, a front-side metal layer 640 was formed on the front side of the pyroelectric substrate 620 in a manner similar to that for forming the back-side metal layer 650. Then, 1000 pyroelectric elements 610 each having a length of 2.5 mm and a width of 2.5 mm were cut out, by dicing, as the pyroelectric elements 610 of Comparative Example 1.

Comparative Example 2

A pyroelectric element was made as Comparative Example 2. Except that the pyroelectric substrate 620 is a Z-cut plate of lithium niobate, the structure of the pyroelectric element of Comparative Example 2 and the procedure for making it are the same as those of Comparative Example 1.

Evaluation Test 1

For each of the pyroelectric elements of Examples 1 to 3 and Comparative Examples 1 and 2, the thickness of the pyroelectric substrate was measured. In the measurement, the thickness distribution was measured using a laser interferometer. For the pyroelectric element 10 of Example 1 in which the pyroelectric substrate 20 warps, the laser interferometer showed interference fringes representing the thickness distribution. Specifically, on the front side of the pyroelectric substrate 20, a difference in height between the top 27 and the rest (i.e., the amount of warp of the pyroelectric substrate 20) was about 10 μm at the maximum. The thickness of the pyroelectric substrate 20 was 5.0 μm±0.02 μm at a portion where no cavity was formed. The pyroelectric substrate 20 was thinner toward the top 27 of the warp. The pyroelectric substrate 20 was 4.5 μm in thickness at the top 27. For the pyroelectric element 510 of Example 2 in which the pyroelectric substrate 520 warps, the laser interferometer also showed interference fringes representing the thickness distribution. Specifically, on the front side of the pyroelectric substrate 520, a difference in height between a top 527 and the rest (i.e., the amount of warp of the pyroelectric substrate 520) was about 2 μm at the maximum. The thickness of the pyroelectric substrate 520 was 5.0 μm±0.02 μm at a portion where no cavity was formed. The pyroelectric substrate 520 was thinner toward the top 527 of the warp. The pyroelectric substrate 520 was 4.5 μm in thickness at the top 527. The thickness distribution (or difference between the maximum and minimum thicknesses) was about 10% of the minimum thickness, which is taken as 100%. For the pyroelectric element 10 of Example 3 in which the pyroelectric substrate 20 warps, the laser interferometer showed interference fringes representing the thickness distribution. Specifically, on the front side of the pyroelectric substrate 20, a difference in height between the top 27 and the rest (i.e., the amount of warp of the pyroelectric substrate 20) was about 10 μm at the maximum. The thickness of the pyroelectric substrate 20 was 5.0 μm±0.02 μm at a portion where no cavity was formed. The pyroelectric substrate 20 was thinner toward the top 27 of the warp. The pyroelectric substrate 20 was 4.5 μm in thickness at the top 27. In Comparative Examples 1 and 2 where the pyroelectric substrate 620 was 5.0 μm±0.02 μm in thickness, the pyroelectric substrate 620 did not warp and did not have any portions thinner than the rest, such as the tops 27 and 527 of Examples 1 and 2.

Evaluation Test 2

Figure 12:
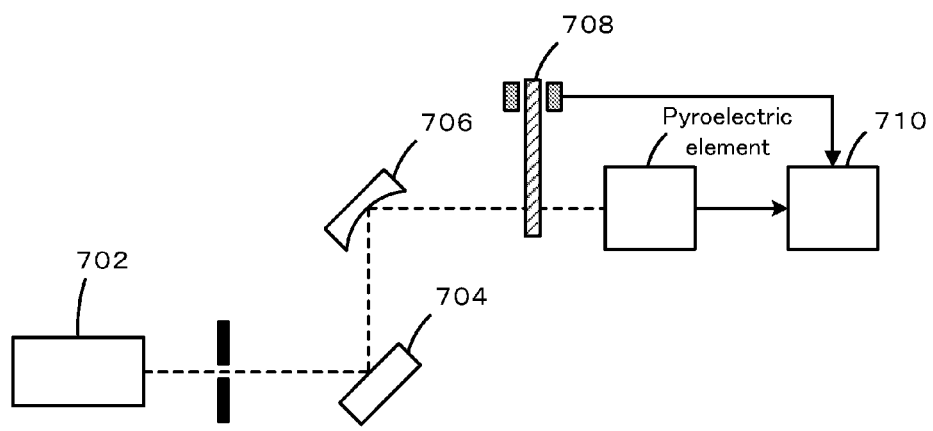
FIG. 12 illustrates an experimental system that measures voltage sensitivities Rv and S/N ratios.

For the pyroelectric elements of Examples 1 to 3 and Comparative Examples 1 and 2, voltage sensitivities Rv and S/N ratios were measured in an experimental system illustrated in FIG. 12. In this experimental system, infrared light emitted from a blackbody radiator 702 to a pyroelectric element was aligned using a plane wave mirror 704 and a concave mirror 706. The infrared light was passed through a chopper 708 and concentrated on a front surface of a light-receiving section of the pyroelectric element. The input infrared light was chopped by the chopper 708 at a frequency of 10 Hz and applied to the pyroelectric element. The voltage sensitivity Rv of the pyroelectric element was measured by a lock-in amplifier 710. An input impedance of a voltage converting circuit in the lock-in amplifier 710 was set to $10^{11}$ Ω. The voltage sensitivity Rv of each pyroelectric element is shown in Table 1.

Next, a noise voltage Vn was detected when there was no input infrared light was measured. Main noise components were temperature noise, tan δ noise, and input impedance noise. From these measured values, the S/N ratio was calculated by the following equation:

$$S/N = A^{0.5} \times Rv/Vn$$

where A is the light-receiving area of the sensor. The S/N ratio of each pyroelectric element is shown in Table 1.

TABLE 1

| | Pyroelectric substrate | Cut angle θ(°) | Thickness of substrate (μm) | Voltage sensitivity Rv | S/N ratio (cm√Hz/W) |
|---|---|---|---|---|---|
| Example1 | Y-offcut plate LT | 42 | 5[X.1] | 330 | 9.8 × 108 |
| Example2 | Y-offcut plate LT | 42 | 5[X.1] | 14000 | 2 × 108 |
| Example3 | Z-cut plate LN | — | 5[X.1] | 150 | 6 × 108 |
| Comparative Example1 | Y-offcut plate LT | 42 | 5 | 330 | 8 × 108 |
| Comparative Example2 | Z-cut plate LN | — | 5 | 150 | 5 × 108 |

[X.1]Thickness of substrate where no cavity was formed.

The result of Evaluation Test 1 confirmed that in the pyroelectric element of each of Examples 1 to 3, the pyroelectric substrate warps at a portion opposite the cavity when, after the composite body having a cavity at a portion opposite the light-receiving sections (back-side electrodes) is formed, the front side of the pyroelectric substrate is ground until a predetermined thickness is reached. It was also confirmed that in the pyroelectric element of each of Examples 1 to 3, the pyroelectric substrate is thinner at the top interposed between the light-receiving sections, unlike in Comparative Examples 1 and 2.

The result of Evaluation Test 2 confirmed, from a comparison between Example 1 and Comparative Example 1 and a comparison between Example 3 and Comparative Example 2, that the S/N ratio indicating the level of performance of the pyroelectric element is large and the level of performance of the pyroelectric element is high when the pyroelectric substrate is thinner at the top 27 interposed between the light-receiving sections 61 and 62, the light-receiving portions 21 and 22 are thinner than light-receiving portions 621 and 622 of Comparative Examples, and the pyroelectric substrate 20 warps and the light-receiving area of the light-receiving sections 61 and 62 is large.

This application is based on and claims priority from Japanese Patent Application No. 2011-37850 filed on Feb. 24, 2011, which is hereby incorporated by reference herein in its entirety.

INDUSTRIAL APPLICABILITY

The present invention is applicable to infrared detectors (e.g., human body sensors and fire sensors) that include a pyroelectric element.

DESCRIPTION OF THE REFERENCE NUMERALS

10/110/210/310/410/510/610: pyroelectric element, 10/110/210/310/410/510/610: pyroelectric element, 20/120/420/520/620: pyroelectric substrate, 21/22/321/521/522/621/622: light-receiving portion, 26/426/526/626: cavity-facing region, 27/427/527: top, 30/130/230/330/630:

supporting member, 32/132: supporting layer, 34/134/234/334/634: bonding layer, 36/136/236/336/636: supporting substrate, 38/138/338/538/638: cavity, 40/140/540/640: front-side metal layer, 41/42/341/541/542/641/642: front-side electrode, 46/47/546/547/646/647: lead portion, 50/150/550/650: back-side metal layer, 51/52/351/551/552/651/652: back-side electrode, 56/556/656: lead portion, 61/62/361/561/562/661/662: light-receiving section, 428: region, 702: blackbody radiator, 704: plane wave mirror, 706: concave mirror, 708: chopper, 710: lock-in amplifier

The invention claimed is:

1. A pyroelectric element comprising:
   a pyroelectric substrate;
   a supporting member having a cavity and configured to support the pyroelectric substrate from a back side of the pyroelectric substrate at a portion other than the cavity; and
   a plurality of light-receiving sections, each light-receiving section including a front-side electrode, a back-side electrode, and a portion of the pyroelectric substrate interposed between the front-side and back-side electrodes,
   wherein the front-side electrode is formed on a front side of a cavity-facing region of the pyroelectric substrate and the back-side electrode is formed on the back side of the cavity-facing region of the pyroelectric substrate, the cavity-facing region being a region of the pyroelectric substrate opposite the cavity,
   wherein the pyroelectric substrate warps in the cavity-facing region and is thinner at a crest of the warped substrate than at remaining portions of the warped substrate.

2. The pyroelectric element according to claim 1, wherein the pyroelectric substrate warps to protrude on the front side thereof; and
   the plurality of light-receiving sections are formed in the cavity-facing region of the pyroelectric substrate, other than the crest, such that the crest is between the plurality of light-receiving sections.

3. The pyroelectric element according to claim 1, wherein the supporting member is made of materials having thermal conductivities lower than that of a material of the pyroelectric substrate.

4. The pyroelectric element according to claim 1, wherein the pyroelectric substrate is 0.1 μm to 10 μm in thickness in the cavity-facing region.

5. A method for manufacturing the pyroelectric element of claim 1, comprising the steps of:
   (a) forming a composite body that includes a flat pyroelectric substrate having the back-side electrode thereon and the supporting member having the cavity at a portion opposite the back-side electrode, wherein the supporting member is configured to support the flat pyroelectric substrate from a back side of the flat pyroelectric substrate at the portion other than the cavity;
   (b) grinding a front side of the flat pyroelectric substrate until the flat pyroelectric substrate warps in the cavity-facing region thereof and, the warped pyroelectric substrate is thinner at the crest of the warped substrate than at the remaining portions of the warped substrate; and
   (c) forming the front-side electrode on the front side of the warped pyroelectric substrate such that the front-side electrode is paired with the back-side electrode and the plurality of light-receiving sections are formed.

6. The method for manufacturing the pyroelectric element according to claim 5, wherein in the step (b), the front side of the flat pyroelectric substrate is ground until the warped pyroelectric substrate reaches a thickness of 0.1 μm to 10 μm in the cavity-facing region.

* * * * *